(12) United States Patent
Hsu et al.

(10) Patent No.: US 6,920,067 B2
(45) Date of Patent: Jul. 19, 2005

(54) INTEGRATED CIRCUIT EMBEDDED WITH SINGLE-POLY NON-VOLATILE MEMORY

(75) Inventors: Ching-Hsiang Hsu, Hsin-Chu (TW); Chih-Hsun Chu, Hsin-Chu (TW); Ming-Chou Ho, Hsin-Chu (TW); Shih-Jye Shen, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 223 days.

(21) Appl. No.: 10/248,193

(22) Filed: Dec. 25, 2002

(65) Prior Publication Data
US 2004/0125652 A1 Jul. 1, 2004

(51) Int. Cl.[7] .............................................. G11C 16/04
(52) U.S. Cl. ............................ 365/185.26; 365/185.28
(58) Field of Search .................... 365/185.26, 185.28, 365/185.29; 257/315, 318

(56) References Cited

U.S. PATENT DOCUMENTS

| | | | | |
|---|---|---|---|---|
| 5,732,207 A | * | 3/1998 | Allen et al. ..................... 714/5 |
| 5,761,121 A | * | 6/1998 | Chang ..................... 365/185.14 |
| 5,896,315 A | * | 4/1999 | Wong ..................... 365/185.01 |
| 6,157,574 A | * | 12/2000 | Kalnitsky et al. ...... 365/185.26 |

* cited by examiner

Primary Examiner—Vu A. Le
(74) Attorney, Agent, or Firm—Winston Hsu

(57) ABSTRACT

A system on chip (SOC) contains a core circuit and an input/output (I/O) circuit embedded with an array of single-poly erasable programmable read only memory cells, each of which comprises a first PMOS transistor serially connected to a second PMOS transistor. The first and second PMOS transistors are both formed on an N-well of a P-type substrate. The first PMOS transistor includes a single-poly floating gate, a first P+ doped drain region and a first P+ doped source region, the second PMOS transistor includes a single-poly select gate and a second P+ doped source region, and the first P+ doped source region of the first PMOS transistor serves as a drain of the second PMOS transistor.

18 Claims, 18 Drawing Sheets

INTEGRATED CIRCUIT EMBEDDED WITH SINGLE-POLY NON-VOLATILE MEMORY

BACKGROUND OF INVENTION

1. Field of the Invention

The present invention relates to an integrated circuit embedded with single-poly non-volatile memory (NVM) fabricated using an application specific integrated circuit (ASIC) or conventional logic process.

2. Description of the Prior Art

In previous designs, an electronic system would be based on a board populated with a microprocessor or microcontroller, memory, discrete peripherals, and a bus controller. Today, such a system can fit on a single chip, hence the term System On Chip (SOC). SOC is an IC consisting of a processor, embedded memory, various peripherals, and an external bus interface. Embedded memory can be either volatile (SRAM, DRAM) or non-volatile (ROM, Flash). Peripherals vary from the general purpose (Counter/Timers, UART, Parallel I/O, Interrupt controller, etc) to the specialized (LCD Controller, Graphics Controller, Network Controllers, etc). The external bus interface allows the SOC to interface with external memory devices and peripherals with little or no glue logic. Almost every semiconductor company that has a processor, or access to one, is developing SOC products. This advancement in technology allows system designers to reduce system testing and size, improve reliability, and shorten the time to market for their products.

It is desirable, when embedding memory cells into a standard logic process, to do so without changing the single-poly process typically used in the fabrication of the logic circuitry. This desire has led to the development of a single-poly ROM cell having $N^+$ source and $N^+$ drain regions formed in a $P^-$ substrate and a polysilicon gate overlying a channel region extending between the source and the drain. An N diffusion region formed in the $P^-$ substrate serves as the control gate and is capacitively coupled to the floating gate via a thin oxide layer. The oxide layer has a tunnel window opened in a portion thereof near the $N^+$ drain to facilitate electron tunneling. The control gate and floating gate of this single-poly ROM cell form a capacitor in a manner similar to that of the more traditional stacked-gate, or double-poly, EEPROM cells. However, the above-described N-channel single-poly ROM cell is disadvantageous since it requires programming and erasing voltages of 20 V. These high programming and erase voltages limit the extent to which the size of such cells may be reduced.

Sung and Wu, in U.S. Pat. No. 6,044,018, disclose a single-poly memory device that can be fabricated with a conventional CMOS process sequence. A complimentary cell couples the floating gate of an NMOS device to the floating gate of a PMOS device. Each gate at least partially overlaps a source region and a drain region. A channel-stop region adjacent to the source of the PMOS device inhibits formation of a channel between the source and drain, and hence essentially eliminates current flow from the drain to the source in the PMOS device, even when a voltage is present between the source and drain and the floating gate has sufficient potential to otherwise initiate a channel.

Nevertheless, the single-poly memory device disclosed in U.S. Pat. No. 6,044,018 suffers from several drawbacks. First, the prior art memory device consumes a lot of chip area since it is composed of a PMOS device and an NMOS device, and hence an extra field oxide layer is needed for isolating the PMOS form the NMOS. Second, the prior art EEPROM cell needs an extra channel stop region and the formation of a conductor for connecting two gates, this, in turns, means extra process steps and thus raised cost.

SUMMARY OF INVENTION

Accordingly, it is a primary object of the claimed invention to provide a single-poly non-volatile memory (NVM) cell that is operated at a lower programming voltage and can be fabricated with a conventional logic process, thereby incorporating into a system on a chip fabrication process. The single-poly NVM device according to this invention can be operated at relatively low voltages and is thus a low power consumption NVM memory.

It is another object of the claimed invention to provide a SOC embedded with high-density single-poly NVM device that is logic process compatible and consumes small per unit chip area and is power saving.

It is still another object of the claimed invention to provide a unique embedded high-density single-poly NVM device and related operation methods.

According to one embodiment of the claimed invention, an integrated circuit (IC) comprises a core circuit and an input/output (I/O) circuit embedded with an array of single-poly non-volatile memory cells, each of which comprises a first transistor serially connected to a secondtransistor. The first and second transistors are both formed on a well of a semiconductor substrate. The first transistor includes a single-poly floating gate, a first drain region and a first source region, the second PMOS transistor includes a single-poly select gate and a second source region, and the first source region of the first transistor serves as a drain of the second transistor.

In a programming mode, a well voltage is applied to the well, and a drain of the first transistor is biased to a first voltage, thereby coupling a second voltage on the single-poly floating gate to turn on a channel under the single-poly floating gate. It is advantageous to use the present invention because the embedded single-poly non-volatile memory cells have a same transistor or device structure as the transistor structure of the I/O circuit device (i.e., the embedded single-poly non-volatile memory cells are made from some of the I/O circuit devices, or fabricated with substantially the same design rule), and thus they can sustain relatively higher voltages than the core circuit device does. The core circuit devices are operated at lower voltages and higher speeds.

In different process technologies, the I/O devices with the same operating voltage range will behave the same electrical performances. Meanwhile, due to process technique improvement, the shrinkage in the device size is still observed. Another object of the claimed invention to provide a embedded single-poly nonvolatile memory (NVM) cells formed by the devices which are the same as those in I/O circuits can be easily ported to different process technologies which provide the same I/O devices. Thus, the embedded NVM cells can be also shrunk to a smaller cell size due to process improvement.

Other objects, advantages and novel features of the invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The preferred embodiment in accordance with the present invention will be discussed in detail with reference to FIG. 1 to FIG. 18. It is understood that the type of semiconductor regions, device layout, and polarity of voltages are chosen solely for illustration, and person having ordinary skill in the art would recognize other alternatives, variations, and modifications.

Figure 1:
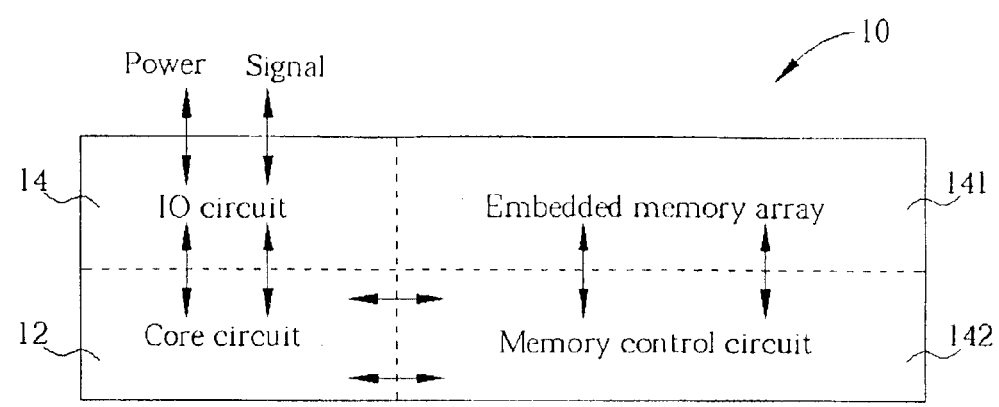
FIG. 1 is a block diagram schematically showing an integrated circuit (IC) embedded with a single-poly NVM therein according to the present invention.

Please refer to FIG. 1. FIG. 1 is a block diagram schematically showing an integrated circuit (IC) embedded with a single-poly non-volatile memory (NVM) therein according to the present invention. As shown in FIG. 1, the IC 10 comprises a core circuit 12 and an input/output (I/O) circuit 14. The core circuit 12 comprises a plurality of core circuit devices (either PMOS or NMOS, not shown in this figure), which are operated at relatively low voltages and high speed and are fabricated using advanced logic process such as 0.25-micron technology. That is, the core circuit devices have a critical dimension of about 0.25 microns, thinner gate oxide thickness, and therefore smaller device dimension and faster speed. It is understood that, heretofore, some chip manufacturers have advanced to 0.18-micron, 0.13-micron, even beyond 100-nanometer technology, and the present invention is not limited thereto.

The I/O circuit 14 comprises I/O circuit devices, which can sustain relatively higher voltages such as 3.3V. A portion of the 3.3V I/O circuit devices are used to constitute an array of non-volatile memory (embedded NVM) 141 and a memory control circuit 142 thereof. The communication (bus) between the embedded NVM 141 and the memory control circuit 142 and between the core circuit 12 and the memory control circuit 142 employs technologies known in the art and the details are therefore omitted.

Figure 2:
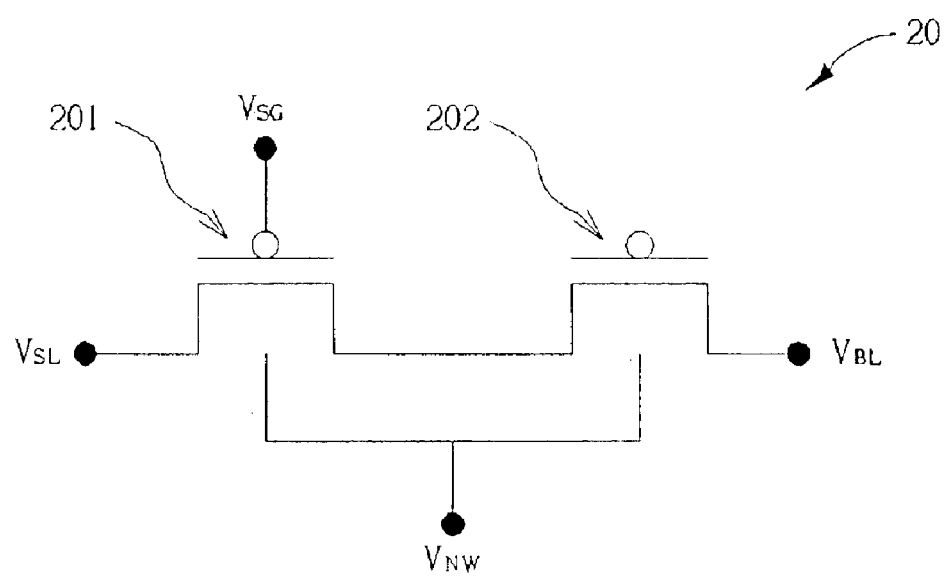
FIG. 2 demonstrates a P-type NVM cell according to the present invention.
Figure 3:
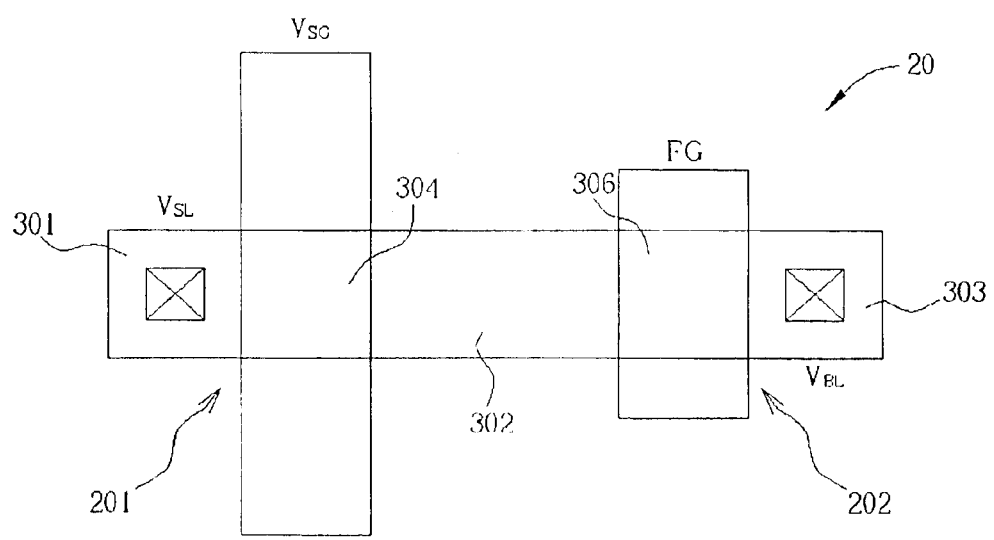
FIG. 3 is an enlarged top view showing the layout of the NVM cell of FIG. 2.

Please refer to FIG. 2 through FIG. 10. It is also an object of the claimed invention to provide a unique embedded high-density single-poly NVM device and related operation methods. Referring first to FIG. 2 and FIG. 3, FIG. 2 is a circuit of a NVM cell according to the present invention. FIG. 3 is an enlarged top view showing the layout of the NVM cell according to the present invention. As shown in FIG. 2 and FIG. 3, the NVM device 20 comprises two serially connected PMOS transistors 201 and 202. The PMOS transistor 201 acts as a select transistor or switch transistor and the select gate of the PMOS transistor 201 is electrically connected to a word line. In operation, a select gate voltage ($V_{SG}$) is applied to the select gate of the PMOS transistor 201 via the specific word line. The PMOS select transistor 201 further comprises a source terminal 301 biased to a source line voltage ($V_{SL}$) and a drain terminal 302 coupled to the PMOS transistor 202. That is, the drain terminal 302 of the PMOS transistor 201 simultaneously serves as a source terminal of the PMOS transistor 202. The PMOS transistor 202 further comprises a single-poly floating gate 306 and a drain terminal 303 that is biased to a bit line voltage ($V_{BL}$). The drain terminal 302 of the PMOS transistor 201 (also the source of the PMOS transistor 202) and the drain terminal 303 define a P-channel under the floating gate 306.

TABLE 1

| Operation | Selected WL | Un-selected WL | Selected BL | Unselected BL | Source Line | N-well |
|---|---|---|---|---|---|---|
| Write "1" | 0 V | 5 V | 0 V | 5 V | 6 V | 6 V |
| Write "0" | 0 V | 5 V | 5 V | 5 V | 5 V | 5 V |
| Read | 0 V | 3.3 V | 2.3 V | 3.3 V | 3.3 V | 3.3 V |

Figure 4:
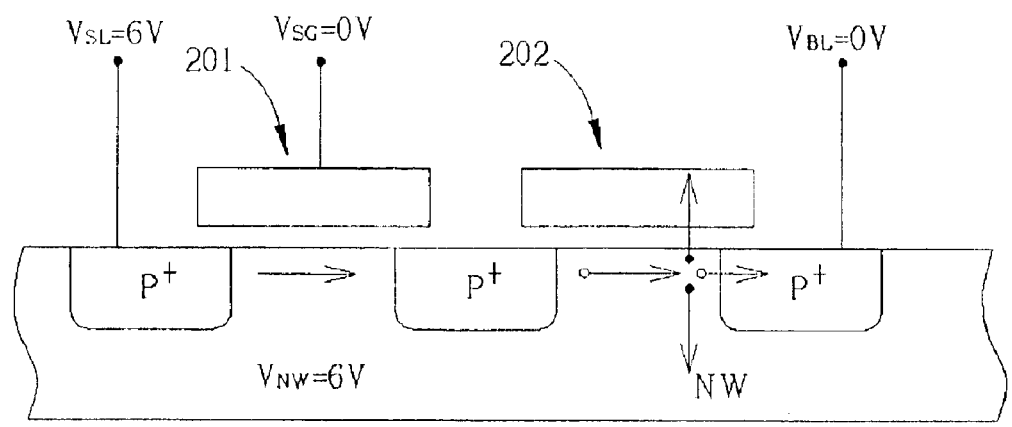
FIG. 4 to FIG. 7 are cross-sectional views of this invention.

Referring to Table 1 and FIG. 4 through FIG. 7, a best mode for low-voltage memory operations is listed in Table 1, and the programming/reading modes regarding the single-poly EPROM device of the present invention are illustrated in cross sectional views. As shown in FIG. 4, in a programming mode for writing "digital one", the selected word line is grounded. The unselected word lines are applied with a positive voltage of about 3V–8V, preferably 5V. The selected bit line is grounded and the unselected bit lines are applied with a positive voltage of about 3V–8V, preferably 5V. A source line voltage $V_{SL}$ of about 5V is applied on the source terminal of the select transistor 201. A well voltage of about 5V is applied to the N-well (NW). Under these conditions, the P-channel of the select transistor 201 and the P-channel under the floating gate of the PMOS transistor 202 turn on and hot channel electrons inject into the floating gate of the single-poly PMOS transistor 202.

Figure 5:
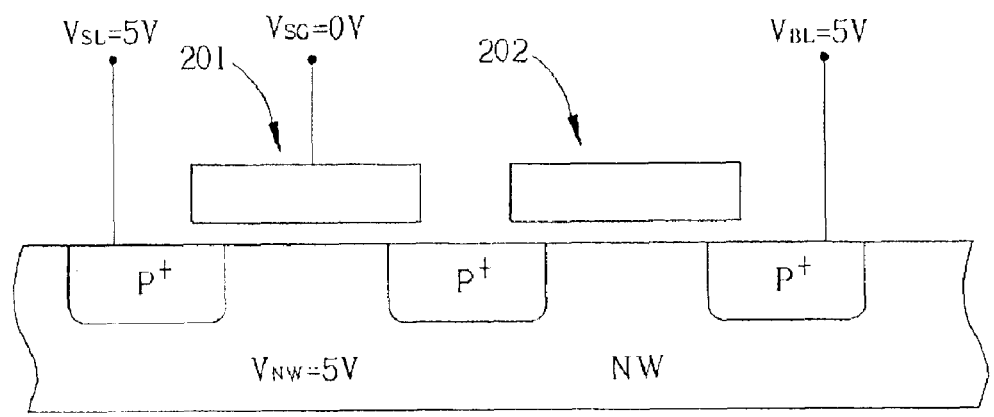

As shown in FIG. 5, in a programming mode for writing "digital zero", the selected word line is grounded. The unselected word lines are applied with a positive voltage of about 3V–8V, preferably 5V. The selected bit line is applied with a positive voltage of about 3V–8V, preferably 5V. A source line voltage $V_{SL}$ of about 5V is applied on the source terminal of the select transistor 201. A well voltage of about 5V is applied to the N-well. Under these conditions, the P-channel under the floating gate of the PMOS transistor 202 is in an "OFF" state.

Figure 6:
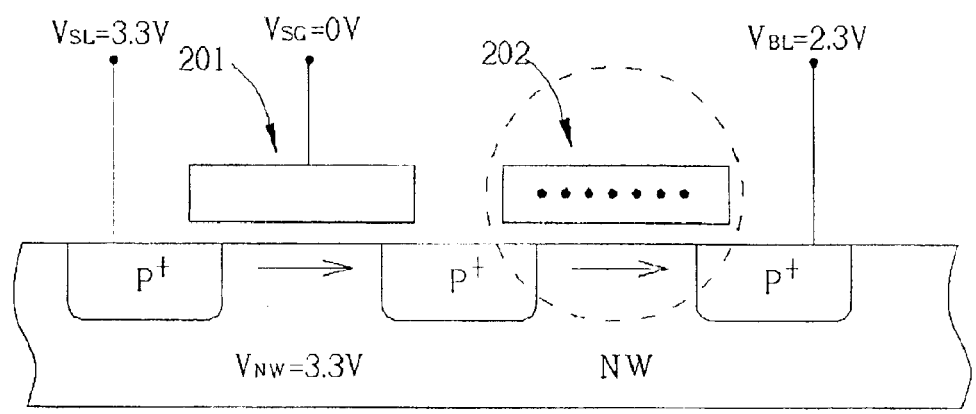
Figure 7:
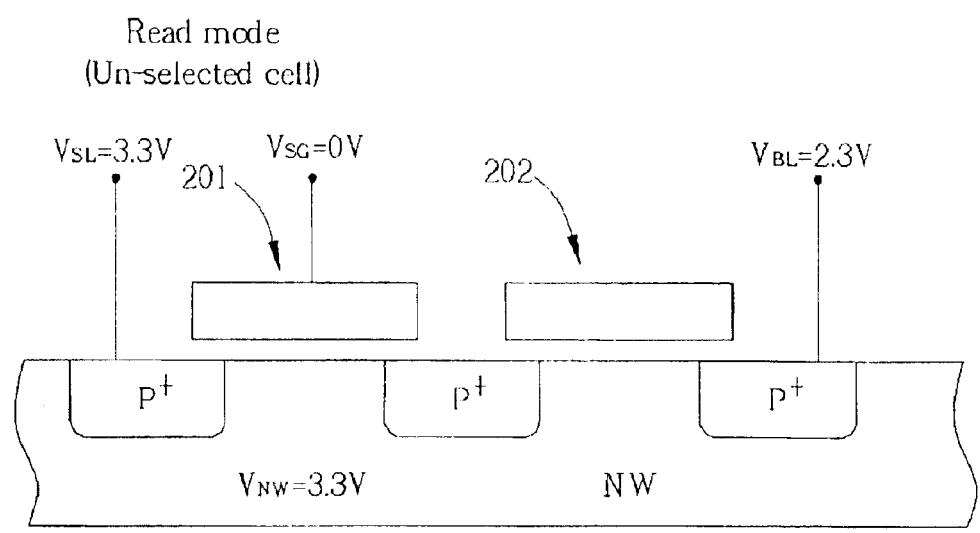

As shown in FIG. 6, in a data reading operation, the selected word line is grounded. The unselected word lines are biased to a voltage of about 2.5V–5V. The selected bit line is biased to a voltage of about 0V–2.5V. The unselected bit lines are biased to a bit line voltage of about 3.3V. The source line voltage is about 2.5V–5V. The N-well voltage is about 2.5V–5V. When reading a programmed cell, the floating gate of the programmed cell is charged, then $V_{FG}-V_S<V_{THP}$ ($V_{THP}$: threshold voltage of PMOS transistor 202), the memory cell maintains at a status of "ON". The floating gates of those un-programmed memory cells have no charge injected therein, then $V_{FG}-V_S>V_{THP}$, these memory cells are in a status "OFF".

Figure 8:
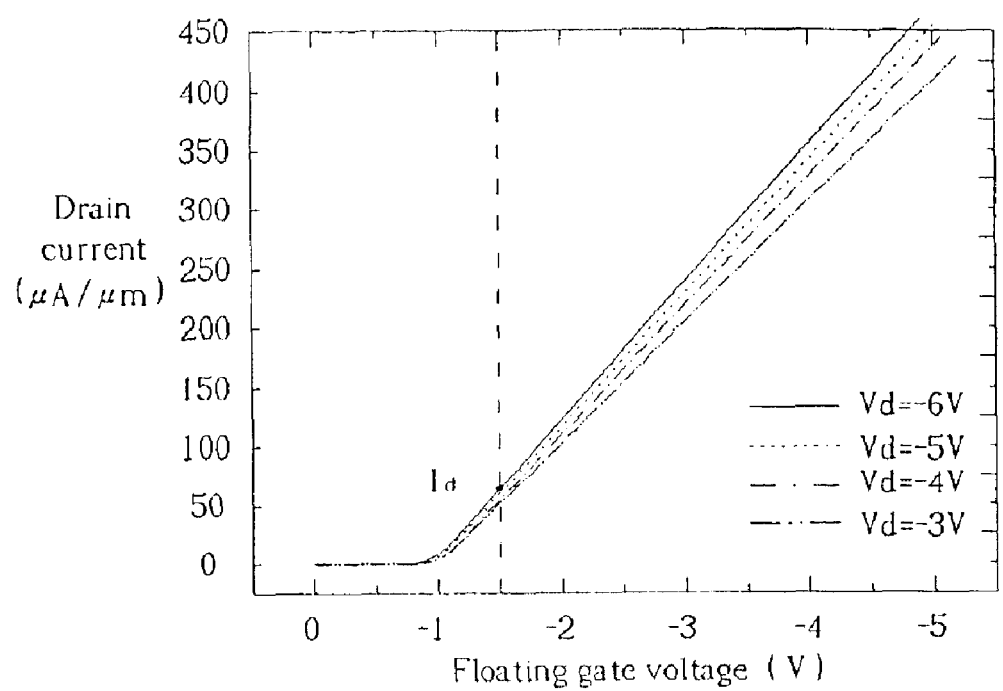
FIG. 8 depicts the relation between the drain current $I_d$ and the floating gate voltage.
Figure 9:
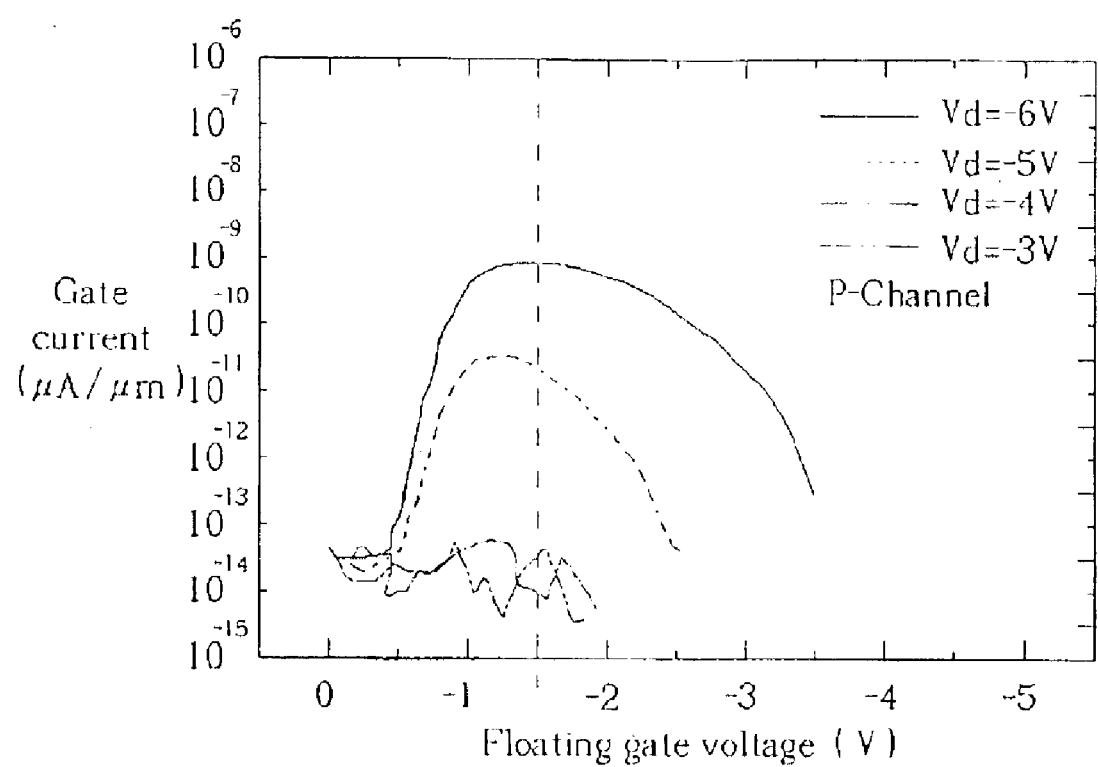
FIG. 9 plots the gate currents versus gate voltages of the floating gate regarding a selected PMOS transistor (Channel Hot Electron (CHE) operation) at different drain to N-well biases ($V_d = V_{BL} - V_{NW}$).

FIG. 8 depicts the relation between the drain current $I_d$ and the floating gate voltage. FIG. 9 plots the gate currents $I_G$ versus gate voltages of the floating gate regarding a selected PMOS transistor (Channel Hot Electron (CHE) operation) at different drain to N-well biases ($V_d=V_{BL}-V_{NW}$). As shown in FIG. 8 and FIG. 9, according to a best mode of the present invention, the drain to N-well bias ($V_d$) is about –5V to –6V. A maximum gate current of about $1.0\times10^{-9}$ to $5\times10^{-11}$ μA/μm is observed at a floating gate voltage of about –1V to –1.5V. More specifically, at a drain bias $V_d$=–5V, for example, the floating gate acquires a relatively low-level coupling voltage of about –1~–2V. At the same time, the P channel thereof is just turned on and reaches a gate current approaching a maximum value of about $5\times10^{-11}$ μA/μm. In other words, a better performance during the writing operation can be achieved according to the present invention, since the gate current to drain current ratio ($I_G/I_d$) is improved.

Figure 10:
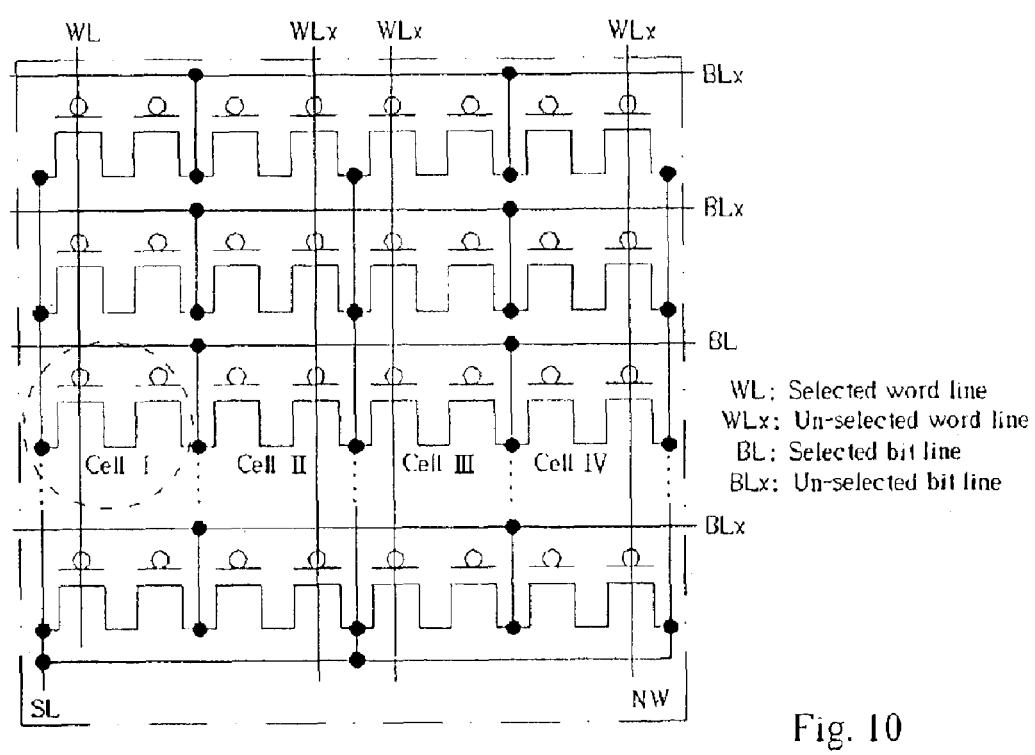
FIG. 10 is an array of the single-poly NVM according to the present invention.

FIG. 10 is a top view illustrating a portion of the memory array of the single-poly NVM according to the present invention. As shown in FIG. 10, for programming (writing "digital one") the cell I (as specifically indicated with dash line cycle), a bit line voltage $V_{BL}$ of about 5V to 6V is applied to the drain terminal of the floating gate PMOS transistor of the memory cell I. The select gate of the memory cell I is grounded. Along the same bit line, the other un-programmed memory cells (cell II, cell III, and cell IV) will not suffer from the drain disturbance that typically occurs during programming for a conventional stacked gate memory device.

Figure 11:
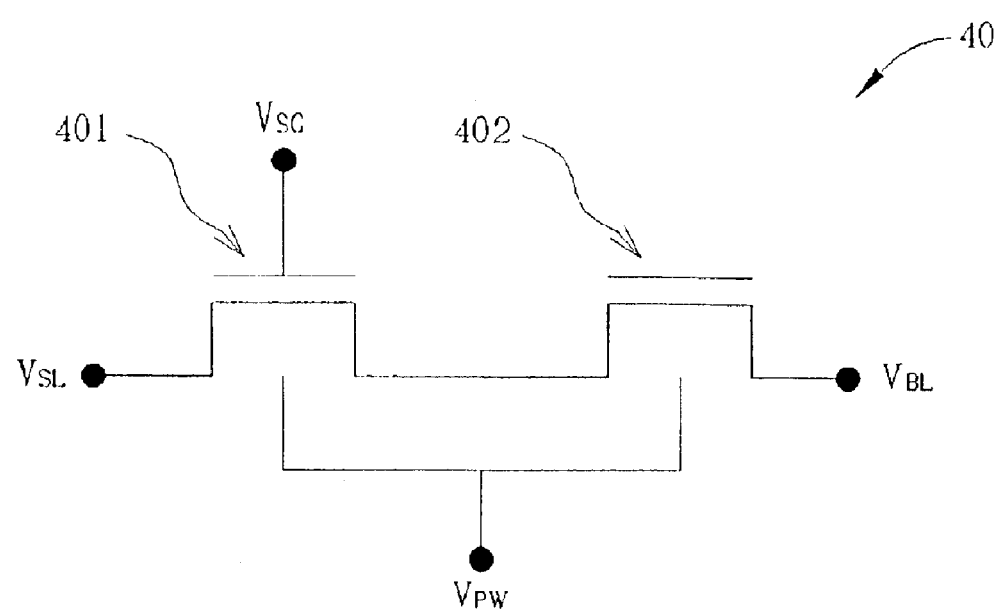
FIG. 11 demonstrates an N-type NVM cell according to the present invention.
Figure 12:
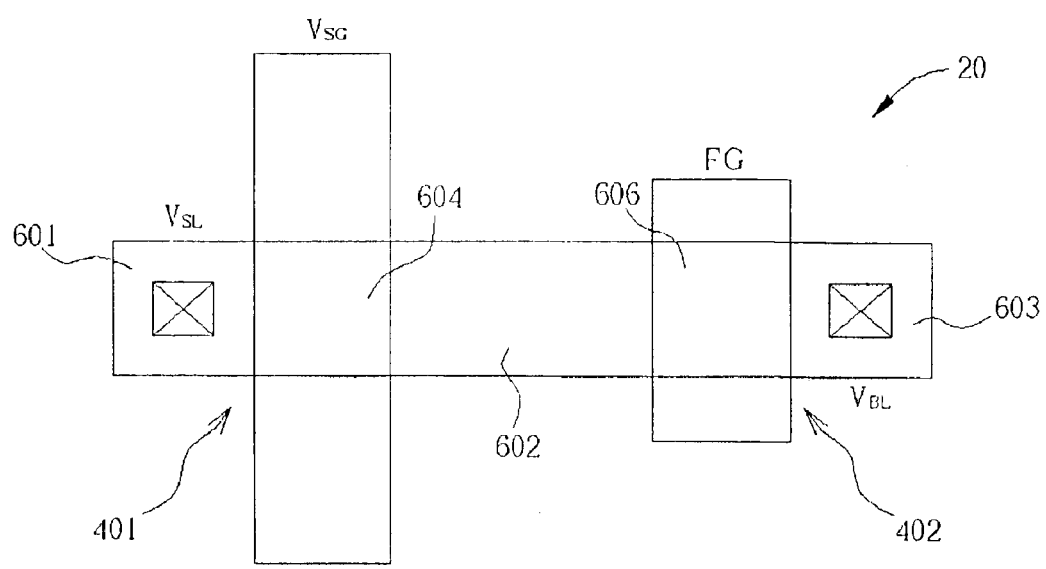
FIG. 12 is an enlarged top view showing the layout of the NVM cell of FIG. 11.

Referring to FIG. 11 and FIG. 12, FIG. 11 is a circuit of a NVM cell according to another preferred embodiment of the present invention. FIG. 12 is an enlarged top view showing the layout of the NVM cell of FIG. 11. As shown in FIG. 11 and FIG. 12, the NVM device 20 comprises two serially connected NMOS transistors 401 and 402. The NMOS transistor 401 acts as a select transistor or switch transistor and the select gate of the NMOS transistor 401 is electrically connected to a word line. In operation, a select gate voltage ($V_{SG}$) is applied to the select gate of the NMOS transistor 401 via the specific word line. The NMOS select transistor 401 further comprises a source terminal 601 biased to a source line voltage ($V_{SL}$) and a drain terminal 602 coupled to the NMOS transistor 402. That is, the drain terminal 602 of the NMOS transistor 401 simultaneously serves as a source terminal of the NMOS transistor 402. The NMOS transistor 402 further comprises a single-poly floating gate 606 and a drain terminal 603 that is biased to a bit line voltage ($V_{BL}$). The drain terminal 602 of the NMOS transistor 401 (also the source of the NMOS transistor 402) and the drain terminal 603 define an N-channel under the floating gate 606.

Figure 13:
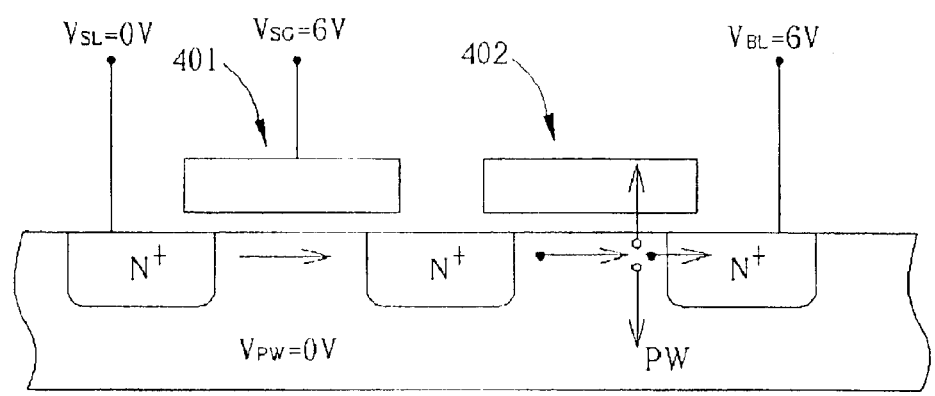
FIG. 13 to FIG. 16 are cross-sectional views of this invention.

Referring to FIG. 13 through FIG. 16, a best mode for programming/reading the single-poly N-type NVM device of the present invention is illustrated in cross-sectional views. As shown in FIG. 13, in a programming mode for writing "digital one", the selected word line is applied with a positive voltage of about 3V–8V, preferably 6V. The selected bit line is applied with a positive voltage of about 3V–8V, preferably 6V. A source line voltage $V_{SL}$=0V is applied on the source terminal of the select transistor 401. A well voltage of 0V is applied to the P-well (PW). Under these conditions, the N-channel of the select transistor 401 is turned on and hot holes inject into the floating gate of the single-poly NMOS transistor 402.

Figure 14:
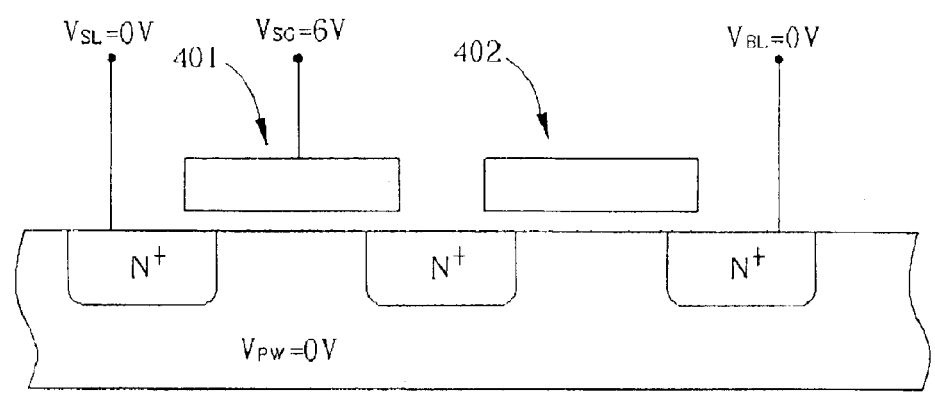

As shown in FIG. 14, in a programming mode for writing "digital zero", the selected word line is applied with a positive voltage of about 3V–8V, preferably 6V. The selected bit line is applied with a voltage of 0V. A source line voltage $V_{SL}$=0V is applied on the source terminal of the select transistor 401. A well voltage of 0V is applied to the P-well (PW). Under these conditions, the N-channel under the floating gate of the PMOS transistor 402 is in an "OFF" state.

Figure 15:
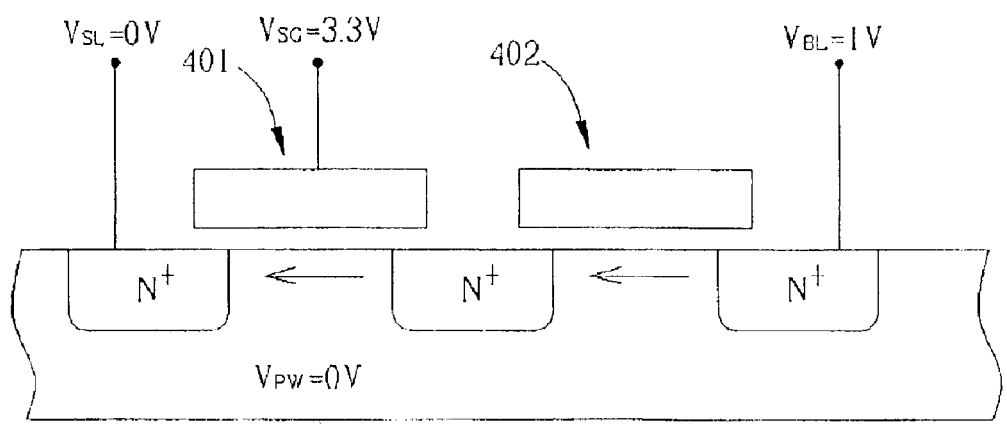
Figure 16:
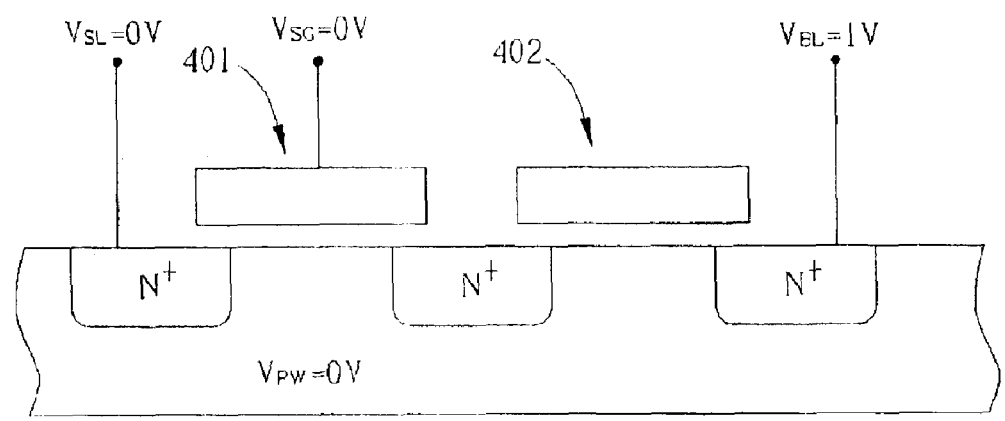
Figure 17:
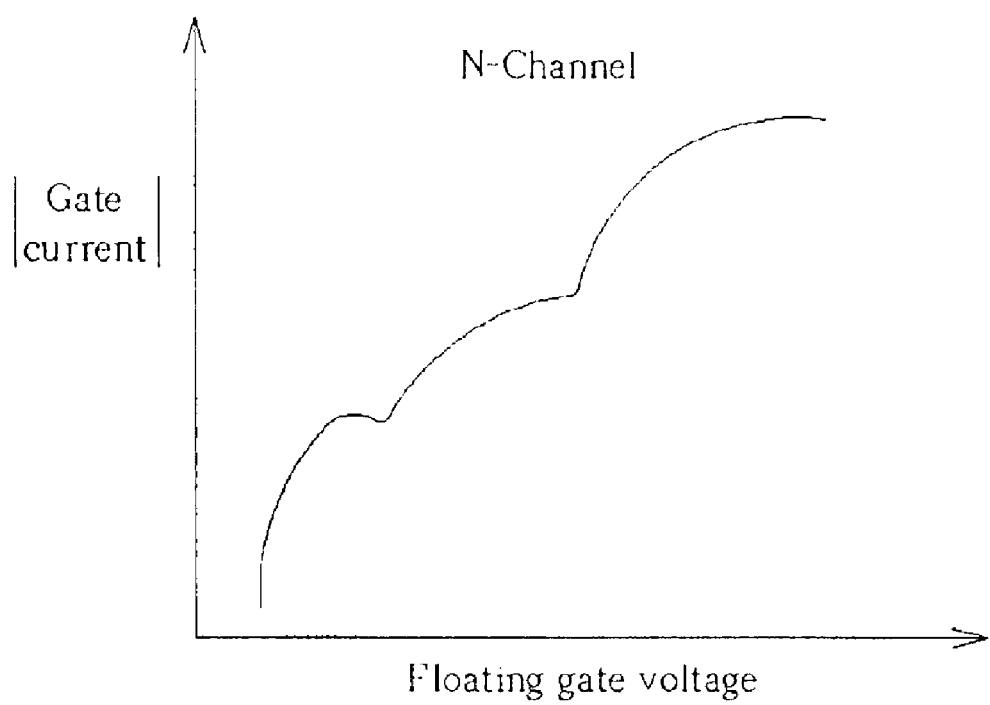
FIG. 17 plots the gate currents versus gate voltages of the floating gate (for N-channel).
Figure 18:
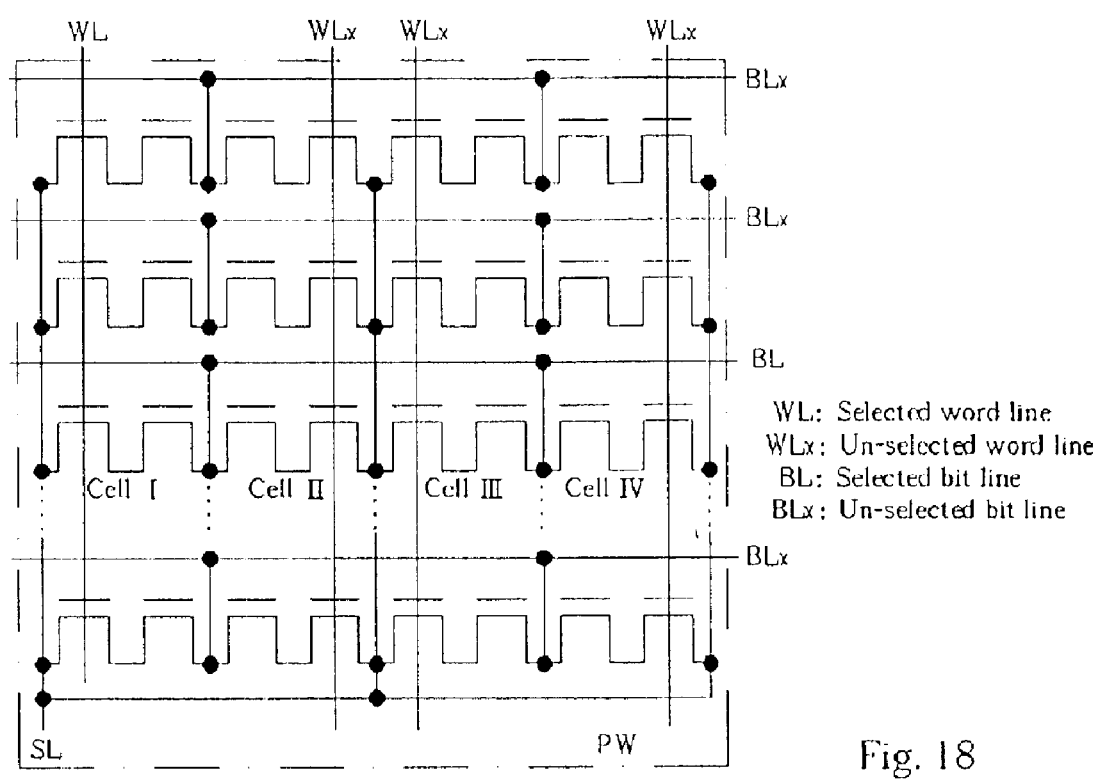
FIG. 18 is an array of the single-poly NVM according to another preferred embodiment of the present invention.

As shown in FIG. 15, in a data reading operation, a select gate voltage $V_{SG}$=3.3V is applied on the selected word line. The selected bit line is biased to a voltage of about 0V–2.5V, preferably 1V. As shown in FIG. 16, the unselected word lines are biased to a voltage of 0V. The unselected bit lines are biased to a bit line voltage of about 0V–2.5V, preferably 1V. The source line voltage is 0V. The N-well voltage is 0V. The operations of the memory cell as set forth through FIG. 13 to FIG. 16 are based on the relation plotted in FIG. 17.

To sum up, the present invention provides an IC embedded with unique NVMs such as EPROM or OTP cells, which is suited for different-generation (such as 0.25-micron, 0.18-micron, or 0.13-micron) advanced logic processes. No matter what generation logic process the core circuit of the IC uses, a portion of the 3.3V I/O devices can be utilized to create an array of NVM and memory control circuit thereof. No additional mask is required for the NVM. The development cycle for the embedded logic NVM memory can thus be shortened for each generation logic process. Further, the high voltage used to program the NVM cells is decoupled in I/O devices such that the high field is not observed between the gate oxide of the I/O devices and the junction-to-well of the I/O devices, thus guarantee the reliability of the device.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. An integrated circuit with embedded single-poly non-volatile memory (NVM), comprising
a core circuit; and
an input/output (I/O) circuit embedded with an array of single-poly non-volatile memory cells, each of the single poly non-volatile memory cells formed in a semiconductor substrate comprising:
a well formed in the semiconductor substrate, the well being electrically connected to a well voltage;
a first metal-oxide semiconductor (MOS) transistor formed in the well;
a drain region of the first MOS transistor electrically connected to a bit line voltage;
a second metal-oxide semiconductor (MOS) transistor formed in the well;
a source region of the first MOS transistor electrically connected to a drain region of the second MOS transistor;
a source region of the second MOS transistor electrically connected to a source line voltage;
wherein the first MOS transistor includes a floating gate which is isolated from any other control terminals, a gate of the second MOS transistor is electrically connected to a select gate voltage, wherein the first and second MOS transistors perform the same electrical behavior as those MOS transistors employed in the I/O circuit.

2. The integrated circuit with embedded single-poly NVM of claim 1 wherein in a programming mode, at the well voltage, the select gate voltage is applied on the gate of the second MOS transistor to turn on the second MOS transistor, and a voltage drop is applied between the drain of the first MOS transistor and the source region of the second MOS transistor to make carriers be injected into the gate of the first MOS transistor.

3. The integrated circuit with embedded single-poly NVM of claim 1 wherein the I/O circuit is further embedded with a memory control circuit.

4. The integrated circuit with embedded single-poly NVM of claim 3 wherein the memory control circuit comprises a sense amplifier, a word line decoder, a bit line decoder, a word line driver, a bit line driver and a charge pumping circuit.

5. The integrated circuit with embedded single-poly NVM of claim 1 wherein the embedded single-poly NVM can be ported to different process technologies in which the I/O devices are operated at the same operation voltage range.

6. An integrated circuit with embedded single-poly non-volatile memory (NVM), comprising a core circuit; and an input/output (I/O) circuit embedded with an array of single-poly non-volatile memory cells, each of the single poly non-volatile memory cells formed in a semiconductor substrate comprising:
  a well formed in the semiconductor substrate, the well being coupled to a well voltage;
  a first metal-oxide semiconductor (MOS) transistor formed in the well;
  a drain region of the first MOS transistor coupled to a bit line voltage;
  a second metal-oxide semiconductor (MOS) transistor formed in the well;
  a source region of the first MOS transistor acting as a drain region of the second MOS transistor;
  a source region of the second MOS transistor coupled to a source line voltage;
wherein the first MOS transistor includes a floating gate which is isolated from any other control terminals, a gate of the second MOS transistor is electrically coupled to a select gate voltage, wherein the first and second MOS transistors perform the same electrical behavior as those MOS transistors employed in the I/O circuit.

7. The integrated circuit with embedded single-poly NVM of claim 6 wherein in a programming mode, at the well voltage, the select gate voltage is applied on the gate of the second MOS transistor to turn on the second MOS transistor, and a voltage drop is applied between the drain of the first MOS transistor and the source region of the second MOS transistor to make carriers be injected into the gate of the first MOS transistor.

8. The integrated circuit with embedded single-poly NVM of claim 6 wherein the I/O circuit is further embedded with a memory control circuit.

9. The integrated circuit with embedded single-poly NVM of claim 8 wherein the memory control circuit comprises a sense amplifier, a word line decoder, a bit line decoder, a word line driver, a bit line driver and a charge pumping circuit.

10. The integrated circuit with embedded single-poly NVM of claim 6 wherein the embedded single-poly NVM can be ported to different process technologies in which the I/O devices are operated at the same operation voltage range.

11. An integrated circuit with embedded single-poly non-volatile memory (NVM), comprising a core circuit; and an input/output circuit embedded with an array of single-poly non-volatile memory cells, each of said single poly non-volatile memory cells formed in a semiconductor substrate comprising:
  an N-type well formed in the semiconductor substrate, the well being electrically coupled to a well voltage;
  a first P-channel metal-oxide semiconductor (PMOS) transistor formed in the well;
  a drain region of the PMOS transistor electrically coupled to a bit line voltage;
  a second P-channel metal-oxide semiconductor (PMOS) transistor formed in the well;
  a source region of the first PMOS transistor electrically connected to a drain region of the second PMOS transistor;
  a source region of the second PMOS transistor electrically coupled to a source line voltage;
wherein the first PMOS transistor includes a floating gate which is isolated from any other control terminals, a gate of the second PMOS transistor is electrically coupled to a select gate voltage, wherein the first and second PMOS transistors perform the same electrical behavior as those PMOS transistors employed in the I/O circuit.

12. The integrated circuit with embedded single-poly NVM of claim 11 wherein in a programming mode, the select gate voltage is applied on the gate of the second PMOS transistor to turn on the second PMOS transistor and a voltage drop is applied between the drain of the first PMOS transistor and the source region of the second PMOS transistor to make carriers be injected into the gate of the first PMOS transistor.

13. The integrated circuit with embedded single-poly NVM of claim 11 wherein the embedded single-poly NVM can be ported to different process technologies in which the PMOS is operated at the same operation voltage range.

14. An integrated circuit with embedded single-poly non-volatile memory (NVM), comprising a core circuit; and an input/output (I/O) circuit embedded with an array of single-poly non-volatile memory cells, each of said single poly non-volatile memory cells formed in a semiconductor substrate comprising:
  a P-type well formed in the semiconductor substrate, the well being electrically coupled to a well voltage;
  a first N-channel metal-oxide semiconductor (NMOS) transistor formed in the well;
  a drain region of the NMOS transistor electrically coupled to a bit line voltage;
  a second N-channel metal-oxide semiconductor (NMOS) transistor formed in the well;
  a source region of the first NMOS transistor electrically connected to a drain region of the second NMOS transistor;
  a source region of the second NMOS transistor electrically coupled to a source line voltage;
wherein the first NMOS transistor includes a floating gate which is isolated from any other control terminals, a gate of the second NMOS transistor is electrically coupled to a select gate voltage, wherein the first and second NMOS transistors perform the same electrical behavior as those NMOS transistors employed in the I/O circuit.

15. The integrated circuit with embedded single-poly NVM of claim 14 wherein in a programming mode, the select gate voltage is applied on the gate of the second NMOS transistor to turn on the second NMOS transistor, and a voltage drop is applied between the drain of the first NMOS transistor and the source region of the second NMOS transistor to make holes be injected into the gate of the first NMOS transistor.

16. The integrated circuit with embedded single-poly NVM of claim 14 wherein in an erase mode, the select gate voltage is applied on the gate of the second NMOS transistor to turn on the second NMOS transistor, and a voltage drop is applied between the drain of the first NMOS transistor and the source region of the second NMOS transistor to make electrons be injected into the gate of the first NMOS transistor.

17. The integrated circuit with embedded single-poly NVM of claim 14 wherein the embedded single-poly NVM can be ported to different process technologies in which the NMOS is operated at the same operation voltage range.

18. An integrated circuit with embedded single-poly non-volatile memory (NVM), comprising a core circuit; and an input/output (I/O) circuit embedded with an array of single-poly non-volatile memory cells, each of said single poly non-volatile memory cells formed in a semiconductor substrate comprising:
  a well formed in the semiconductor substrate, the well being electrically connected to a well voltage;
  a first metal-oxide semiconductor (MOS) transistor formed in the well;
  a drain region of the first MOS transistor electrically connected to a bit line voltage;
  a second metal-oxide semiconductor (MOS) transistor formed in the well;
  a source region of the first MOS transistor acting as a drain region of the second MOS transistor;
  a source region of the second MOS transistor electrically connected to a source line voltage;

wherein the first MOS transistor includes a floating gate which is isolated from any other control terminals, a gate of the second MOS transistor is electrically connected to a select gate voltage, wherein the first and second MOS can be ported to different process technologies in which I/O devices are operated at the same operation voltage.

* * * * *